US005206465A

United States Patent [19]

Jung

[11] Patent Number: 5,206,465

[45] Date of Patent: Apr. 27, 1993

[54] SOUND COLLECTING AND CONCENTRATING DEVICE FOR ATTACHING TO THE BACK OF A LOUDSPEAKER

[76] Inventor: Gin Kon Jung, 93-73 GA Jung Ang Dong, Iri-City Jungbuk 570-120, Rep. of Korea

[21] Appl. No.: 714,529

[22] Filed: Jun. 13, 1991

Related U.S. Application Data

[63] Continuation-in-part of Ser. No. 531,660, Jun. 1, 1990, Pat. No. 5,025,886.

[51] Int. Cl.$^{5}$ .............................................. H05K 5/00

[52] U.S. Cl. .................................. 181/152; 181/156; 181/159; 181/179; 181/192

[58] Field of Search ............... 181/152, 156, 159, 163, 181/179, 185, 192, 196, 197; 381/152, 154, 156

[56] References Cited

U.S. PATENT DOCUMENTS

| | | | |
|---|---|---|---|
| 2,228,886 | 1/1941 | Olson | 181/158 |
| 3,993,162 | 11/1976 | Juuti | 181/156 |
| 4,439,644 | 3/1984 | Bryney, III | 181/199 X |
| 4,524,846 | 6/1985 | Whitby | 181/152 |
| 4,616,731 | 10/1986 | Robinson | 181/153 |
| 4,655,315 | 4/1987 | Saville | 181/153 |
| 4,807,293 | 2/1989 | Weckler | 181/152 |
| 4,930,596 | 5/1990 | Saiki et al. | 181/156 |
| 4,969,196 | 11/1990 | Nakamura | 181/152 X |

*Primary Examiner*—Michael L. Gellner
*Assistant Examiner*—Khanh Dang
*Attorney, Agent, or Firm*—Pennie & Edmonds

[57] ABSTRACT

This invention relates to a loudspeaker having at least one sound collecting tubes attached to the rear of the speaker frame or the sound collecting tubes forming the speaker frame for collecting and directing sound waves emitted from the rear of the speaker diaphragm. The sound collecting tube is particularly useful for directing and boosting sound waves emitted from the rear of the speaker which is otherwise dissipated or absorbed by the loudspeaker housing material or insulation. In addition, conventional or specialized sound horns may be readily attached to the outlet end of the sound collecting tubes which can direct sound waves emitted by the speaker to any desired direction.

22 Claims, 12 Drawing Sheets

FIG. 6
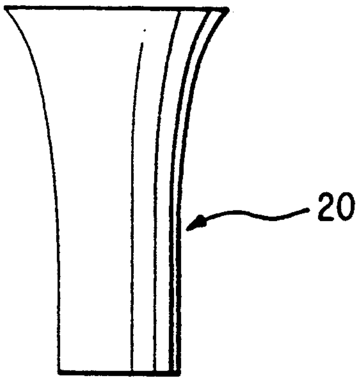
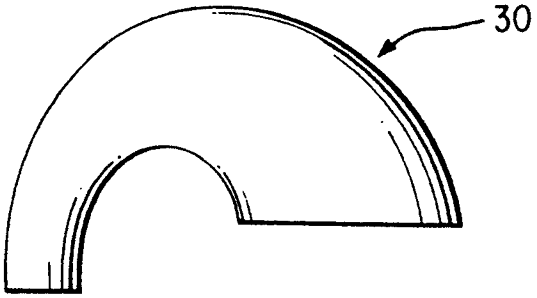
FIG. 7
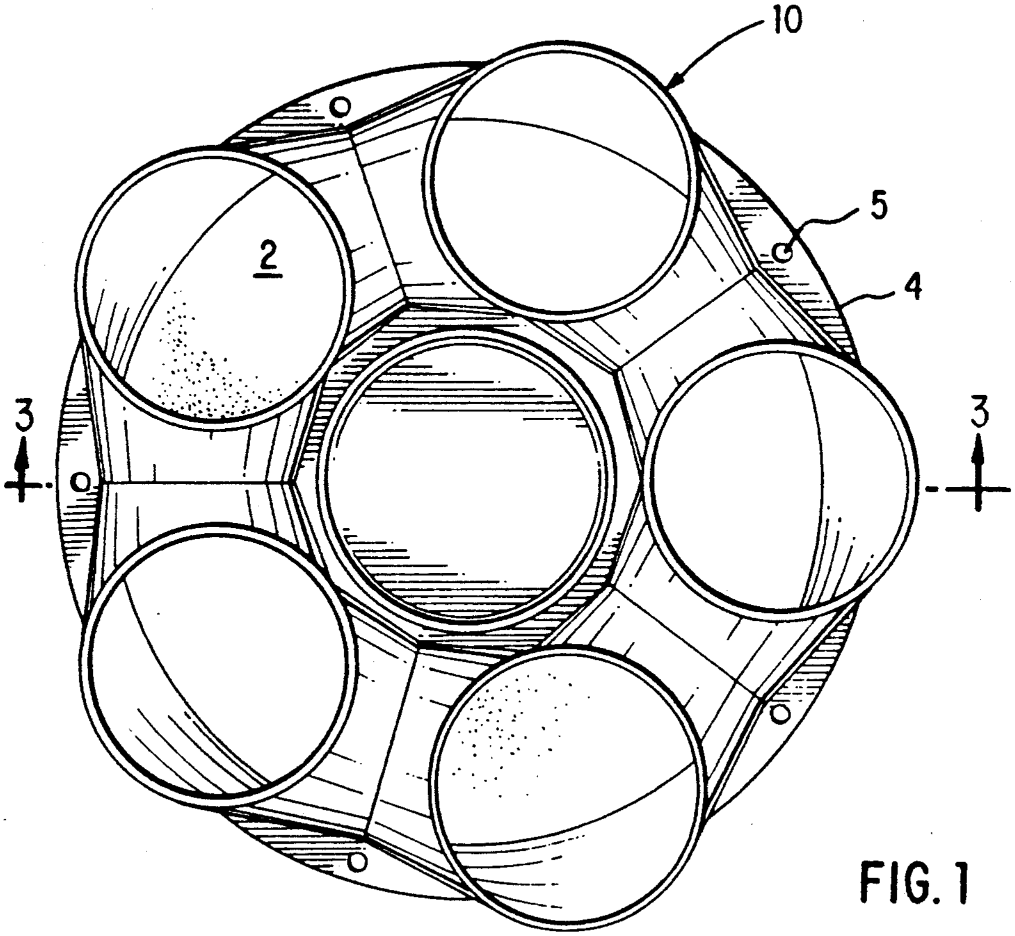
FIG. 1

SOUND COLLECTING AND CONCENTRATING DEVICE FOR ATTACHING TO THE BACK OF A LOUDSPEAKER

CROSS REFERENCE

This application is a continuation-in-part of application Ser. No. 07/531,660, now U.S. Pat. No. 5,025,886, dated Jan. 14, 1981, filed Jun. 1, 1990; and is related to Utility Patent Application Ser. No. 07/638,968, filed Jan. 9, 1991; and to the following Design Applications which were all filed on Jan. 9, 1991; Ser. No. 07/639,180; Ser. No. 07/639,179; and Ser. No. 07/639,178.

BACKGROUND OF THE INVENTION

1. Field of the Invention

This invention relates to a novel loudspeaker sound collecting and concentrating tube or tubes that are attached to or are integral with the back of a conventional speaker frame for capturing sound emitting from the back of the loudspeaker.

2. Description of the Prior Art

In the prior inventions, attempts have been made to improve the efficiency of loudspeaker systems and while at the same time to accurately reproduce high-fidelity sound. Specifically, attempts have been made in two areas of the loudspeaker system: improvement in loudspeaker cone and diaphragm material, utilizing modern technology and improvement in the housing to reduce unwanted vibrations within a loudspeaker housing.

A loudspeaker system utilizing or manipulating sound waves emitting from the rear or back of the loudspeaker has been proposed, for example, in U.S. Pat. Nos. 4,439,644 to Bruney, III, 4,524,846 to Whitby, 4,655,315 to Saville, 4,807,293 to Weckler, and 4,930,596 to Saiki et al.

In U.S. Pat. No. 4,439,644 to Bruney, III, a loudspeaker system utilizes a plurality of vinyl sheets having different thicknesses to seal the rear of a speaker housing, to relieve pressure behind the loudspeaker driver, and to attenuate sound waves emitted from the back of the speaker. While this type of system minimizes the housing vibration and generation of the spring-like compression effect or the resonant booming effect often associated with an acoustic suspension enclosure, the speaker is not as efficient as a ported speaker system in general. Unlike the prior inventions, the present invention collects sound waves emitted from the rear of a loudspeaker and directs the collected sound waves to a single sound concentrating horn and the like. The sound waves emitted from the back of a loudspeaker do not disperse nor are absorbed by the speaker housing.

In U.S. Pat. Nos. 4,524,846 to Whitby and 4,807,293 to Weckler, a loudspeaker system directs sound waves emitted from the back of a loudspeaker through a convoluted path formed by baffles formed within the housing. This type is known to provide a fairly reputable performance. However, due to sound waves colliding against the baffles stationed in the housing, the baffles and the housing unit are prone to unwanted vibrations when the speaker is driven at high levels, thus diminishing the high fidelity capability.

In U.S. Pat. Nos. 4,655,315 to Saville and 4,930,596 to Saiki et al., a loudspeaker is housed in a specially configured sound collecting tube to modify the frequency response. The efficiency of the speaker, however, in such an arrangement suffers because sound travels through a restricted opening. Furthermore, because of the frequency response modification, colored or distorted sound becomes apparent, whereas in the present invention, a freely aspirated sound collecting tube is not designed to color sound. Thus, sound generated from the loudspeaker is heard without the addition of unwanted sound colorization.

SUMMARY OF THE INVENTION

This invention relates to a novel loudspeaker system where at least one sound collecting and concentrating tube is formed in the back of a loudspeaker frame to capture sound waves otherwise dissipated by the insulation material in the speaker housing or by baffles and/or walls within a loudspeaker housing. Specifically, the area of the speaker frame, which supports the diaphragm and a speaker driving means which includes a permanent magnet and voice coil, situated in the back of the speaker, is minimized to prevent sound waves emitted from the diaphragm toward the rear of the speaker from reflecting off the frame and back into the diaphragm. This maximizes the utilization of sound waves emitted from the rear of the speaker and in return maximizes the efficiency and the high-fidelity capability of the speaker.

The sound collecting tube is shaped in the form of a cylinder toward the outlet. Moreover, at the outlet end of each tube, an integral horn or an interchangeable horn can be attached, which can be variably positioned to direct sound waves to a desired direction. The horn can be in the shape of brass instruments or sound amplifying horns, which concentrates sound waves passing therethrough. Essentially, the horn prevents sound waves from dispersing radially and instead outputs sound waves to a specific direction. A person standing in line with the direction of the attached horn thus hears sound louder.

Accordingly, one object of my invention is to provide a loudspeaker capable of efficiently and accurately reproducing high fidelity sound by providing at least one sound collecting tube at the back of the speaker.

Another object of the invention is to provide a loudspeaker capable of selectively directing the output of sound waves emitted toward the rear of the speaker at any desired direction.

Another object of the invention is to provide a loudspeaker capable of removably and adjustably attaching at least one sound concentrating device, which can be selectively directed at any direction, to the back of the loudspeaker.

Another object of the invention is to provide a single sound collecting tube having an integral sound concentrating device and having different inlet cross sectional areas for purposes of attaching to either the entire back area or only certain portions of the back of the loudspeaker.

The foregoing invention and features and advantages of my invention will be better appreciated from the following description.

BRIEF DESCRIPTION OF THE DRAWINGS

FIG. 1 is a rear view of a loudspeaker of the present invention with five sound collecting tubes attached to the speaker.

FIGS. 6 and 7 are differently configured horns that can be attached to the outlet end of each sound collecting tube.

FIG. 8-1 is an isometric view of a third embodiment of the present invention, showing a single sound collecting tube being integral with a sound concentrating horn, and which attaches to the back of a loudspeaker to shroud over all sound venting trapezoidal openings formed in the frame of the loudspeaker.

FIG. 8-2 is a front view of FIG. 8-1.

FIG. 8-3 is a side view of FIG. 8-1.

FIG. 9-1 is an isometric view of a fourth embodiment of the present invention, showing a single sound collecting tube being integral with a sound concentrating horn, and which attaches to the back of a loudspeaker to shroud over three quadrants or three-fourth of the back area of the loudspeaker.

FIG. 9-1A is an isometric view of an alternative embodiment of the fourth embodiment, showing a single sound collecting tube being integral with a sound concentrating horn, and which attaches to the back of a loudspeaker to shroud over the entire back area of the loudspeaker.

FIG. 9-2 is a front-view of FIG. 9-1.

FIG. 9-3 is a side view of FIG. 9-1.

FIG. 10-1 is an isometric view of a fifth embodiment of the present invention, showing a single sound collecting tube being integral with a sound concentrating horn, and which attaches to the back of a loudspeaker to shroud over two quadrants or one-half of the back area of the loudspeaker.

FIG. 10-2 is a front-view of FIG. 10-1.

FIG. 10-3 is a side view of FIG. 10-1.

FIG. 11-1 is an oblique view of a sixth embodiment of the present invention, showing a single sound collecting tube being integral with a sound concentrating horn, and which attaches to the back of a loudspeaker to shroud over one quadrant or one-fourth of the back area of the loudspeaker.

FIG. 11-2 is a front-view of FIG. 11-1.

FIG. 11-3 is a side view of FIG. 11-1.

DETAILED DESCRIPTION OF THE PREFERRED EMBODIMENT

Figure 4:
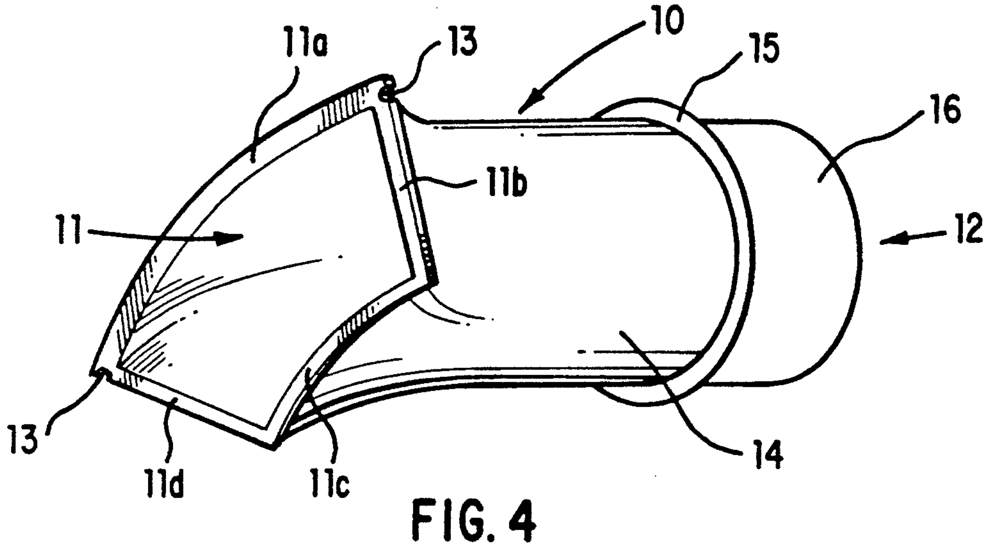
FIG. 4 is a detailed perspective view of one of the five identical sound collecting tubes.
Figure 2:
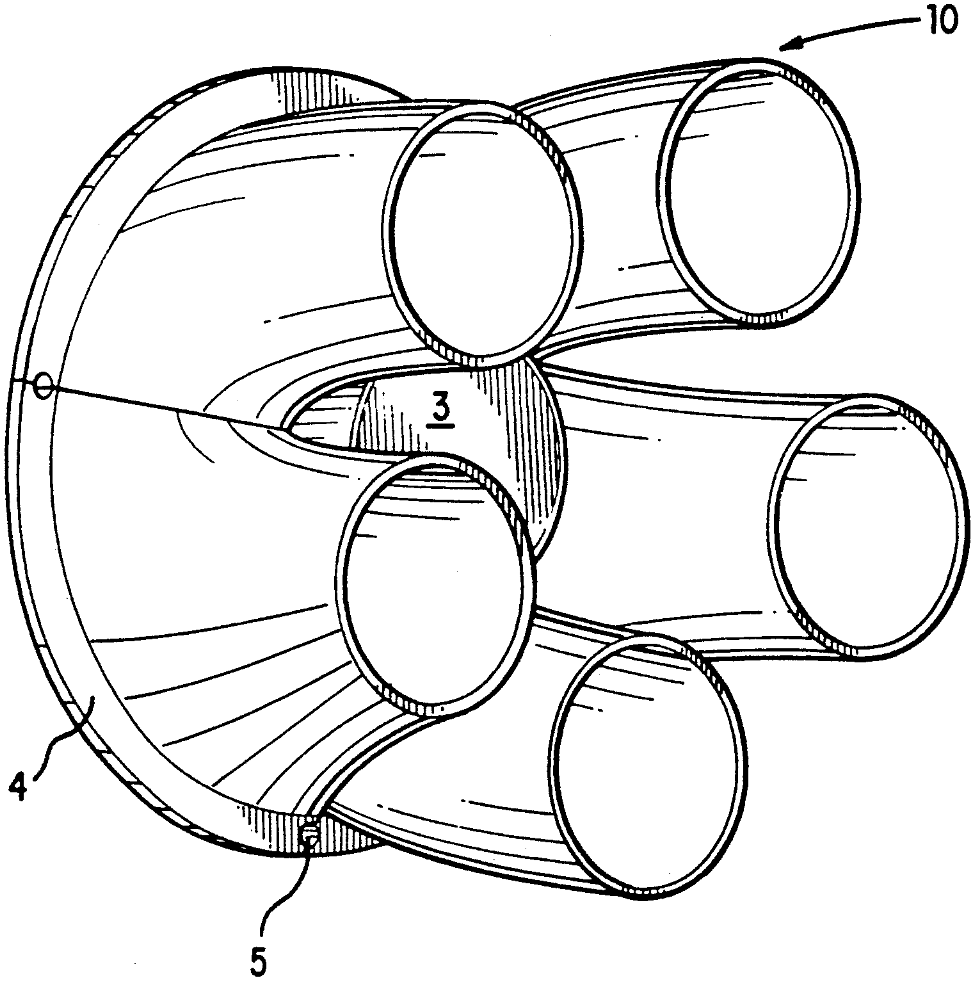
FIG. 2 is a perspective view of the rear of the speaker with the five sound collecting tubes shown more clearly.
Figure 5:
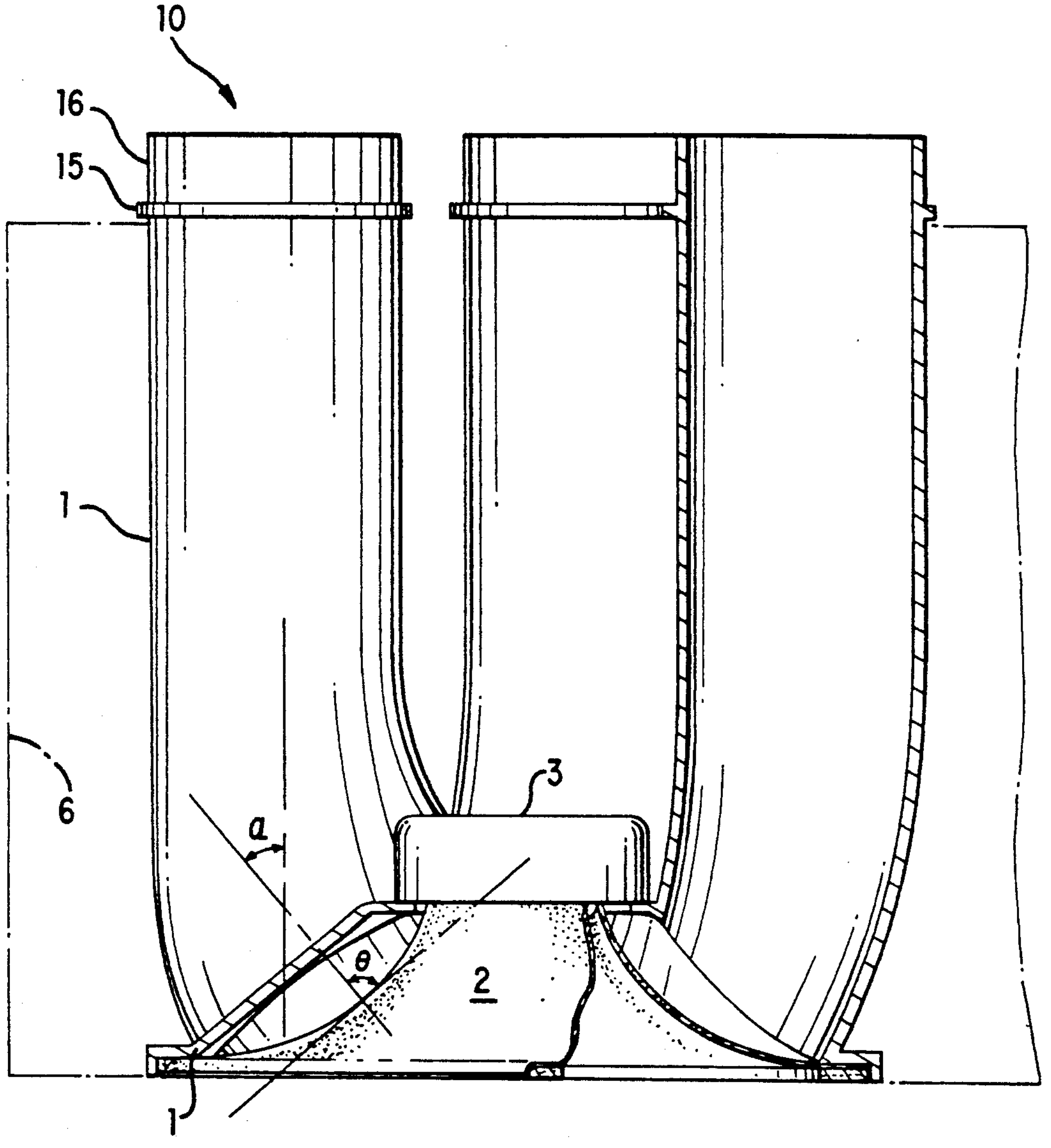
FIG. 5 is a second embodiment of a cross-sectional view of the loudspeaker taken along the line 3—3 of FIG. 1, showing the five sound collecting tubes forming the speaker frame.
Figures 1, 8:
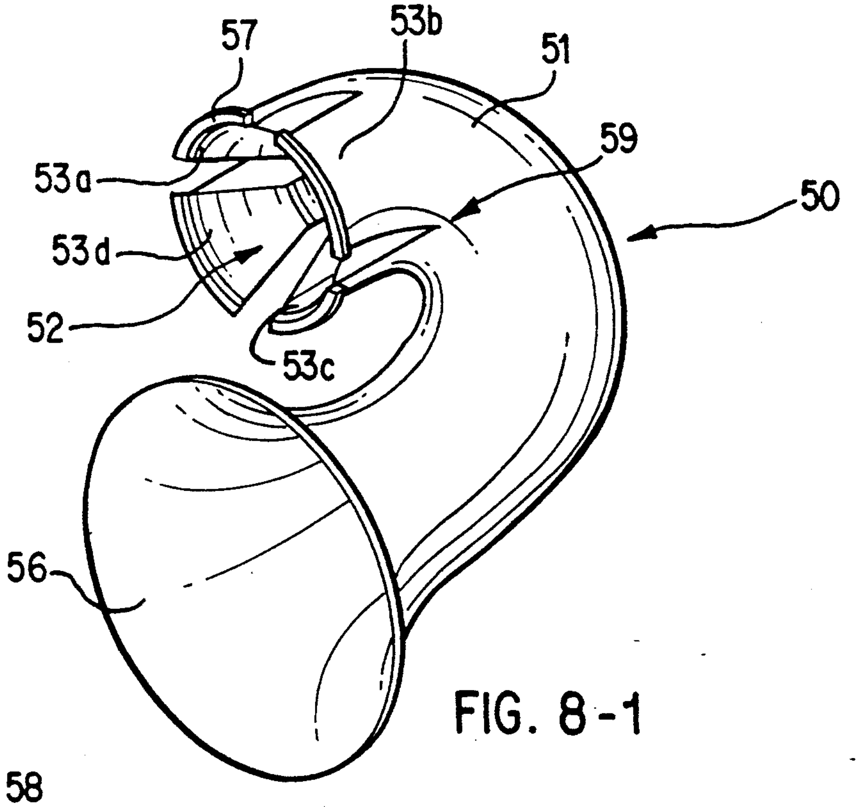
Figures 2, 8:
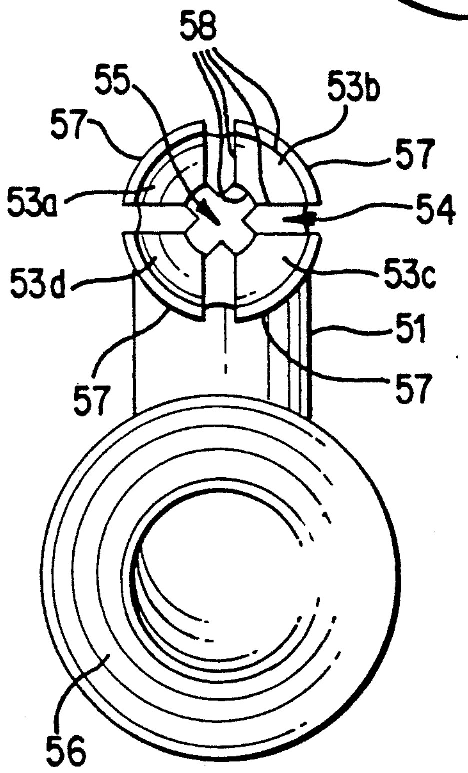
Figures 3, 8:
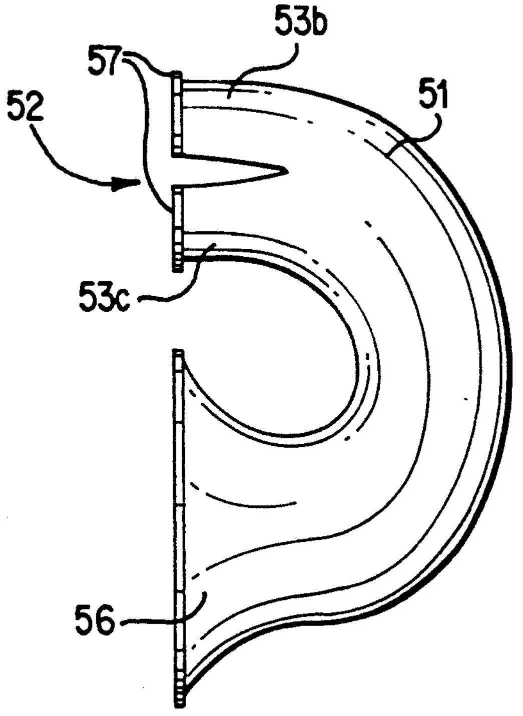

FIGS. 1 and 2 show a new and improved loudspeaker of the present invention which incorporates five identical sound collecting tubes (10) formed on the back of a conventional loudspeaker. While the embodiments of the present invention are shown with five sound collecting tubes, it is to be noted that any feasible number of sound collecting tubes can be used instead. Also, to facilitate better understanding of the present invention and to make the drawings less complex, horn attaching means (15, 16) have not been shown in FIGS. 1 and 2. The sound collecting tube in its entirety is shown in FIGS. 3-5.

Figure 3:
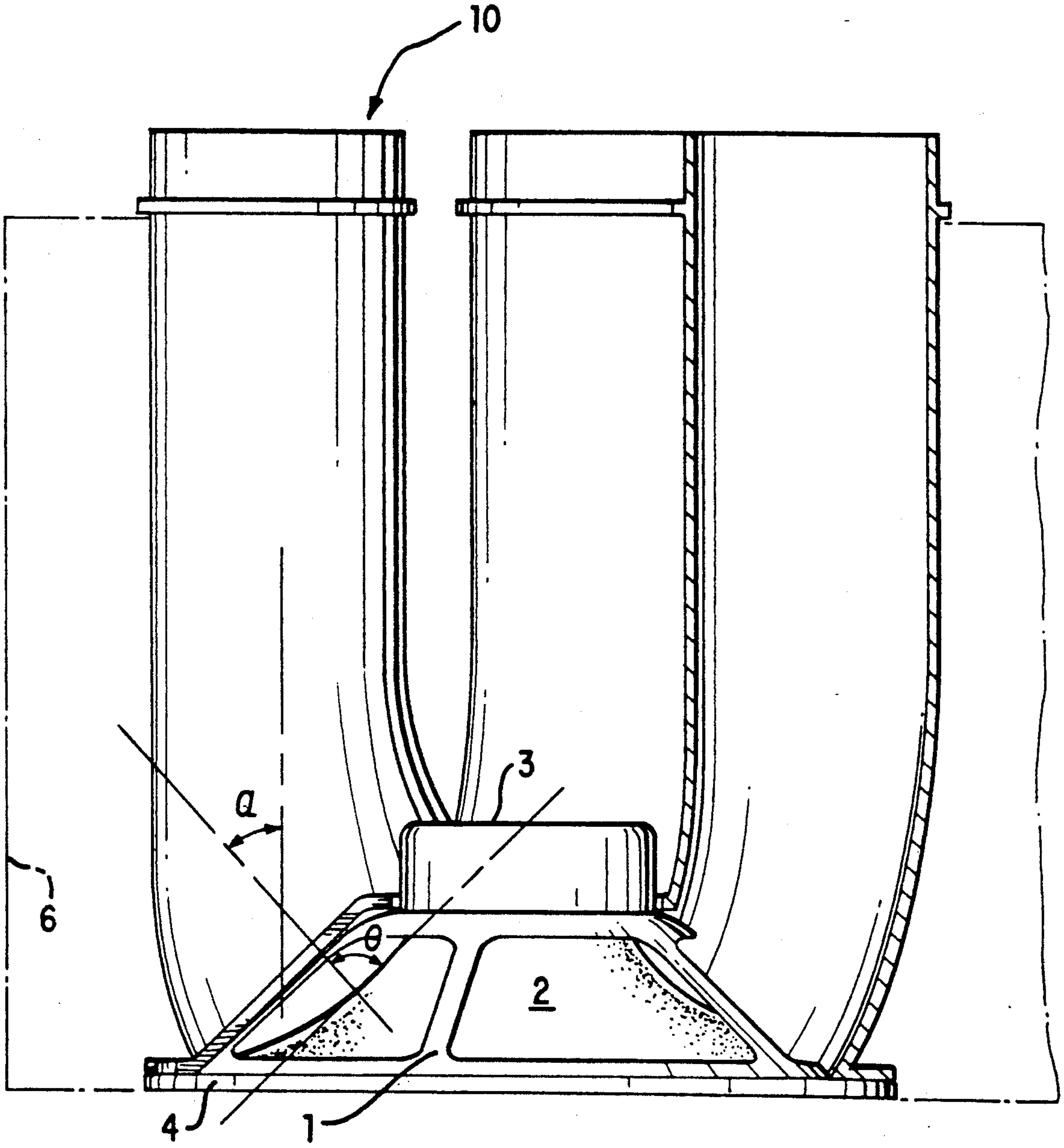
FIG. 3 is a first embodiment of a cross-sectional view of the loudspeaker taken along the line 3—3 of FIG. 1, showing the sound collecting tubes attached to the speaker frame .

In the first embodiment of the present invention, the loudspeaker comprises a diaphragm (2), a cone shaped frame (1) with a plurality of sound venting trapezoidal cut-outs to permit each sound collecting tube to be positioned directly concentric with one of the trapezoidal cut-outs as shown more clearly in FIG. 3. The first embodiment incorporates five trapezoidal cutouts in the frame. However, the present invention also contemplates the use of four sound collecting tubes when the speaker frame is to have only four cut-outs, and so forth. The frame further includes a plurality of openings (5) to permit conventional fastening means such as screws, bolts, or rivets to be positioned therein. Note that each sound collecting tube has a pair of semicircular cut-outs (13) at the sides which are aligned with any two openings (5) of the frame. The sound collecting tubes are fastened to the frame by any said conventional fastening means. However, adhesive or double sided tape may be used in addition to the fastening device to securely and sealingly fasten the tubes to the frame.

FIG. 2 shows a perspective view of the sound collecting tubes attached to the loudspeaker frame. It is apparent from FIG. 2 that each sound collecting tube at the inlet end (11) has a slightly greater cross-sectional area than that of the outlet end (12), with the outlet end having a cylindrical shape. The inlet end of the tube has a curved trapezoidal cross-sectional shape which is gradually and smoothly transformed into a cylindrical cross-sectional shape, forming a cylindrical tube at the outlet end. The cross-sectional area of the inlet end of the tube can also be equal to the outlet end. It is to be understood and noted that the inlet end of the tube corresponds to the size and shape of the back area of the speaker unit. In particular, the shape of the inlet end is so designed to permit maximum flow of sound waves through the tube without the interference from any extraneous objects placed therebetween. Therefore, it is preferable to have a biggest trapezoidal cut-outs as feasible in the frame, without making the frame too fragile.

FIG. 3 shows a cut-away view of the first embodiment, as indicated by 3—3 of FIG. 1, with the loudspeaker and the sound collecting tube arrangement shown more in detail. The chained lines (6) represent a conventional loudspeaker housing unit. Note that the speaker (1) is mounted to the housing by a conventional mounting method with the front of the speaker exposed to the ambient surrounding and the outlet ends of the sound collecting tubes also exposed to the ambient surrounding facing the rear of the speaker housing unit.

The longitudinal axis of each sound collecting tube is positioned at angle $\theta$, approximately orthogonal (90 degrees), at the inlet end with respect to the diaphragm of the loudspeaker and gradually bent at angle $\alpha$, approximately at 30 degrees, as shown clearly in FIG. 3. However, it is to be noted that the sound collecting tubes need not be positioned as described and shown. Rather, the sound collecting tubes can be positioned at any angle with respect to the diaphragm as long as the angle of the tube does not cause interference with sound waves emitting into the sound collecting tubes. In other words, the sound collecting tubes should be positioned at an angle so that there is a minimum unwanted reverberation of sound waves within the inner walls of the sound collecting tubes.

FIG. 4 shows one of the five identical sound collecting tube in more detail. The inlet (11) is shaped as a curving trapezoid bounded by sides (11*a*, 11*b*, 11*c*, 11*d*). The trapezoidal shape corresponds to the sound venting trapezoidal shaped openings in the loudspeaker frame. The inlet sides (11*a*, 11*b*, 11*c*, 1*d*) sealingly engage the loudspeaker frame. The area (1*a*) of the loudspeaker frame immediately adjacent to and facing the back side of the diaphragm is maintained as small as possible to prevent sound waves which are directed toward the frame (1*a*) from reflecting thereof into the back side of the diaphragm. The sound collecting tubes are formed such that when all the sound collecting tubes are mounted to the frame, the outer sides (11*a*) of the inlet end form a circle corresponding to the outer-circular flange (4) of the loudspeaker frame, and the openings (5) are aligned with the semi-circular cut-outs (13) of the sound collecting tubes. Similarly, the inner sides (11*c*) substantially conform with the outer diameter of a speaker driver housing (3).

At the outlet end (12) of the sound collecting tube, horn attaching means (15, 16) is provided to permit conventional horns to be attached thereto. The horn can be attached to the outlet end by conventional tube attaching devices such as clamps, nut-bolt mating devices, or frictional fittings. The tube is also provided with an enlarged circular flange (15) which can act as a limit stop to abut the edge of the horn that engages the outlet end of the sound collecting tube. The length of the sound collecting tube is preferably one-half to twice the radius of the loudspeaker diaphragm to maximize sound waves emitted toward the rear of the speaker and to enable reproduction of high fidelity sound.

FIG. 5 shows a cross-sectional view of the second embodiment of the loudspeaker, as indicated by 3—3 of FIG. 1, with the sound collecting tubes forming the speaker frame (1). The construction of the second embodiment is virtually identical to the first embodiment. As the description relating to the first embodiment, as shown by FIG. 1–4 and as previously described above, applies equally to the second embodiment with the differences noted below, detailed description of the sound collecting tubes of the second embodiment is not deemed necessary. Thus, it is to be understood that the inlet ends of the sound collecting tubes are similarly shaped as the inlet ends of the first embodiment and the inlet sides (11*b*, 11*d*) are integral with the inlet sides (11*d*, 11*b*) of the adjacent sound collecting tubes to form a truncated cone shaped supporting frame (1) for supporting the diaphragm (2).

One major difference between the second embodiment and the first embodiment is that the speaker in the second embodiment does not have a separate speaker frame. Rather, the sound collecting tubes form the speaker frame (1) for supporting the speaker diaphragm (2). In other words, the sound collecting tubes are the speaker frame.

As previously discussed above, the area of the speaker frame, which supports the diaphragm (2) in the back of the speaker, should be minimized to prevent sound waves which are directed toward the speaker frame from undesirably reflecting within the sound collecting tubes and the diaphragm. By having the sound collecting tubes formed as a speaker frame, sound back-up pressure and sound reflections occurring within the sound collecting tubes are substantially avoided since there is no separate speaker frame to interfere with sound waves directed toward the sound collecting tube freely pass directly therethrough without any extraneous objects restrictly the passage of sound waves passing therethrough.

FIGS. 6 and 7 merely illustrate differently configured horns that can be connected to the outlet end of each tube of the first and second embodiments. The horns can be any conventional type. The horns are readily interchangeable to enable the listener to use different types of horns depending on the music and the listener's taste of sound. Note that different horns can produce different sound timbre, which change the tone of the sound. Thus, by changing the horns with a different type, the quality of the sound may be deliberately changed to suit to the listener's taste.

The horn (20) is a straight line type for directing sound waves opposite to the front of the speaker. This type of horn is useful in instances where sound needs to be directed toward the front, using the front of the speaker, and back of the speaker, using the horns. The horns can also direct sound waves to a wall or angled walls for reflecting sound waves back toward the front or the sides of the speaker. The curved horn (30) can be used to direct sound waves toward the front or the side of the speaker without the use of walls or equivalent sound reflecting means.

FIGS. 8-1, 9-1, 10-1, and 11-1 illustrate additional embodiments which all incorporate only one sound collecting tube having an integral horn. However, it is to be noted that the present invention is not limited to an integral horn/sound collecting tube. Rather, it is to be noted that it is well within the scope and enablement of the present disclosure to have a detachable horn connecting the outlet of the sound collecting tube, in the manner described above in reference to the first and second embodiments of the present invention. Moreover, while the loudspeaker is not shown, it is to be noted that the sound collecting tube is to be attached to the back of the flange (4) of a loudspeaker in a conventional manner, for instance by bolts, rivets, glue, etc., as disclosed above in reference to the first embodiment.

Further, as previously noted in reference to the first embodiment of the present invention, the loudspeaker to be used in conjunction with the third, fourth, and fifth embodiments, as shown in FIG. 3, comprises a diaphragm (2), a cone shaped frame (1) with a plurality of curved sound venting trapezoidal cut-outs in the cone shaped frame to permit the inlet end segment(s) concentric cover some or all of the trapezoidal cut-outs which are shown in FIG. 3.

FIGS. 8-1, 8-2, and 8-3 illustrate the third embodiment. The sound collecting and concentrating device (50) comprises a sound collecting tube (51) with its inlet end (52) having a diameter that is substantially equal to that of a loudspeaker that is to be attached thereto. In the third embodiment, the inlet end of the sound collecting tube has four inlet segments (53*a*, 53*b*, 53*c*, 53*d*) with a respective rim or flange (57) formed at each inlet end segment. Each flange is attached to a conventional flange formed in the conventional loudspeaker, the flange being primarily used for purposes of mounting to a housing frame or a support.

The four inlet segments correspond to the trapezoidal cutouts formed in the back of the loudspeaker. That is, when the sound collecting and concentrating device (50) is mounted to a loudspeaker, each inlet end segment sits concentrically over one or more of the trapezoidal cut-outs in the loudspeaker frame so that sound emitted from the back of the loudspeaker travels through each inlet end segment with a minimum sound interference. Sound further travels through the sound collecting tube where the collected sound from each inlet end segment is combined, the combined collected sound continuing through and out the horn (56).

Each inlet end has a trapezoidal cross section, bounded by four walls (58). The trapezoidal cross sections of the four inlet segments gradually become larger and larger toward the outlet end direction until the four trapezoidal sections merge into a single circular cross section just beyond, in the direction of the sound path, the vicinity indicated by reference numeral (59).

The inlet end of the sound collecting tube further has four slots (54) to permit the frame area (1*a*) between two adjacent trapezoidal cutouts of the loudspeaker to rest therein when the device (50) is mounted to the loudspeaker. Further, a recessed cavity (55) which is formed by the walls (58) of the respective segments (53*a*, 53*b*, 53*c*, 53*d*) is provided for the speaker driving means (3) of the loudspeaker to rest therein when the device (50) is mounted to the loudspeaker.

It is to be noted that each inlet end segment shrouds over one or more trapezoidal cut-outs in the loudspeaker frame. Thus, the four inlet end segments may shroud over a loudspeaker frame having, for example, eight trapezoidal cut-outs, each inlet end segment shrouding over two trapezoidal cut-outs. Alternatively, while the third embodiment is shown with four inlet segments for use with a loudspeaker frame having, for example, four trapezoidal cut-outs, it is to be noted that the present invention contemplates any feasible number of inlet end segments corresponding to the number of cut-outs formed in the loudspeaker frame. For example, if a loudspeaker frame has five trapezoidal cutouts, a sound collecting tube formed with five inlet end segments may be used. This alternative embodiment may also be used with a loudspeaker frame having ten trapezoidal cut-outs, in the manner just described.

FIGS. 9-1, 9-2, and 9-3 illustrate the fourth embodiment. The fourth embodiment is similar to the third embodiment, with the exception of having only a single inlet segment which encompasses three-fourth of the back outlet area of the loudspeaker. The sound collecting and concentrating device (60) comprises a sound collecting tube (61) with its inlet end (62) having a diameter that is substantially equal to that of a loudspeaker that is to be attached thereto. In the fourth embodiment, however, the inlet end (62) of the sound collecting tube is formed as a single unitary inlet segment which is designed to attach to three quadrants of the back of the loudspeaker using a rim or flange (67) formed at the inlet end. The flange is attached to a conventional flange (4) formed in the conventional loudspeaker using conventional attaching means as set forth above with respective to the description of the first embodiment.

The inlet end in the fourth embodiment, as shown in the figures is designed to shroud or cover three quadrants of the loudspeaker so that sound emitting or projecting from the back of the loudspeaker travels through the inlet end with minimum sound interference and through and out the horn (66). Because the inlet end shrouds three quadrants of the back of the loudspeaker, the number of trapezoidal cut-outs formed in the back of the loudspeaker is not of concern, as long as the three quadrants fully cover the trapezoidal quadrants formed within the inlet end, and there is no undue interference from the frame reverberating sound passing therethrough. Moreover, a recessed cavity (65) that is formed by the walls (68) is provided to accommodate the protruding speaker driving means (3) of the loudspeaker. It is to be noted that, because only three quadrants of the loudspeaker are to be shrouded, the speaker driver accommodating cavity (65) does not communicate with the collected sound traveling path. In other words, the walls (68) isolate the speaker driving means (3) from the sound traveling path.

Figures 1, 9:
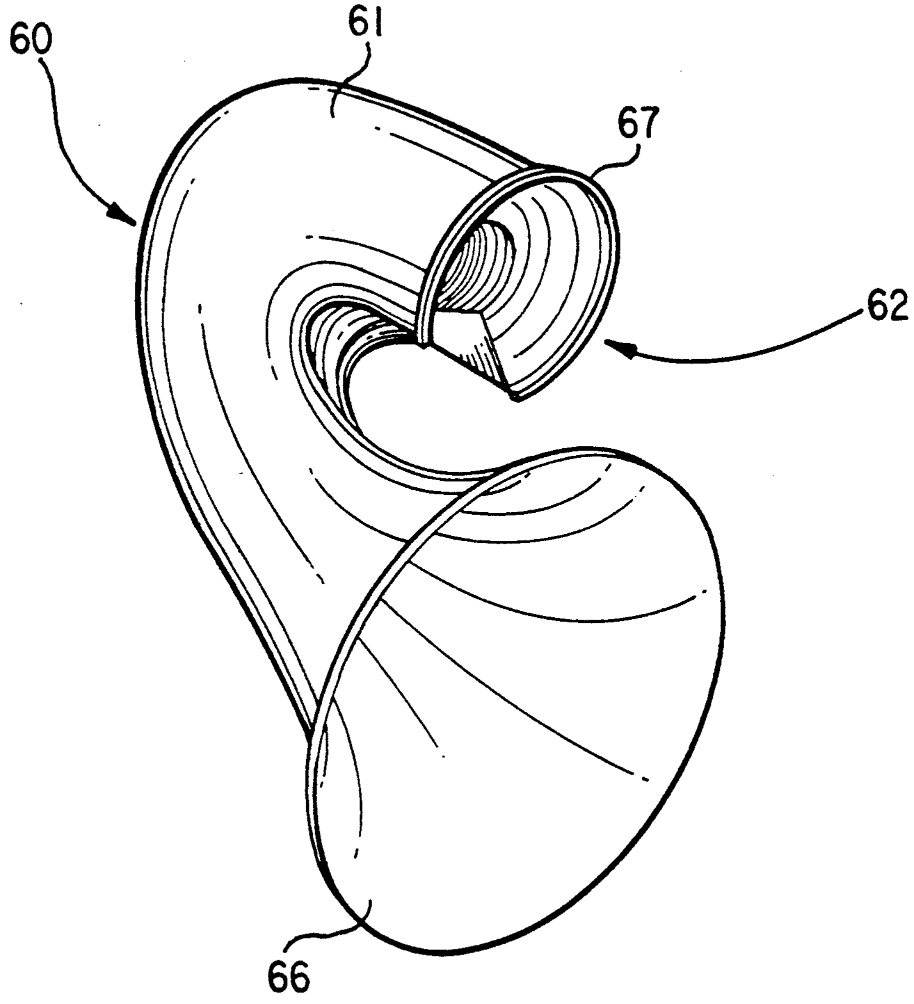
Figures 1A, 9:
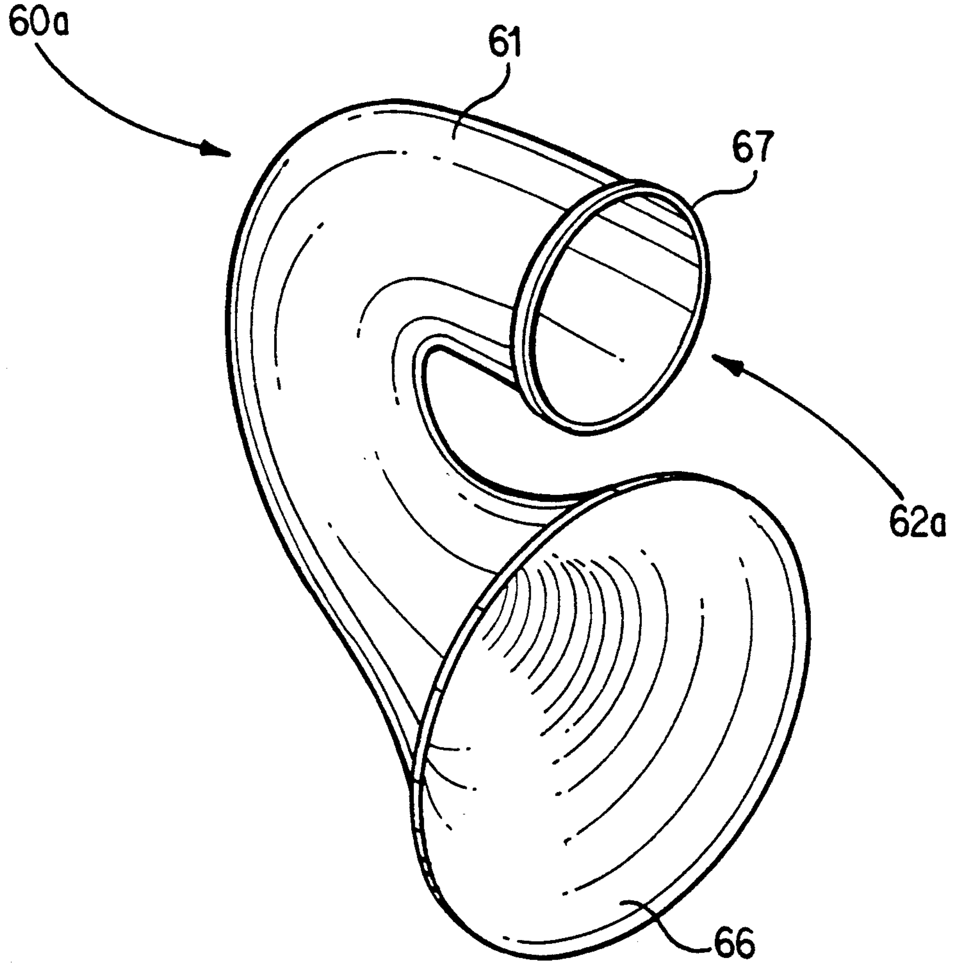
Figures 2, 9:
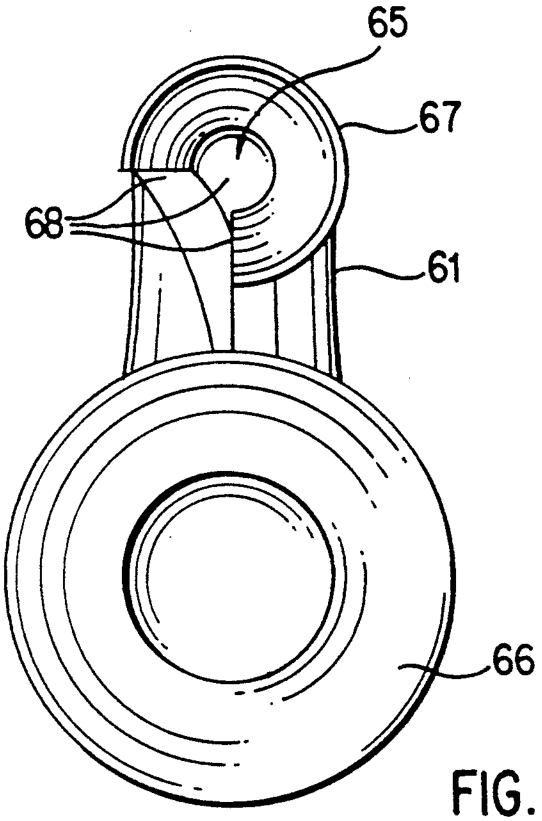
Figures 3, 9:
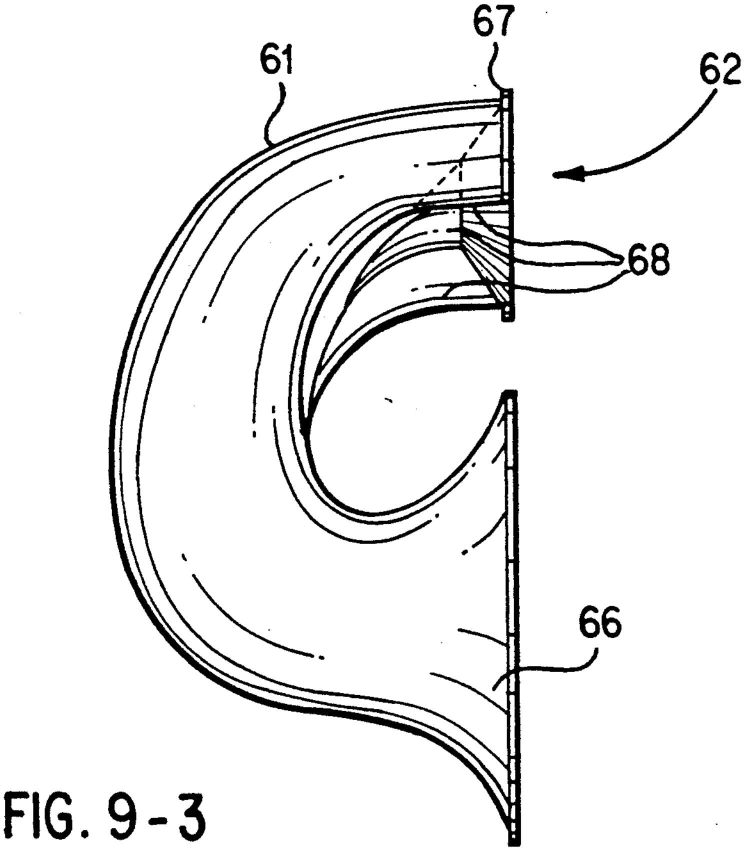
Figures 1, 10:
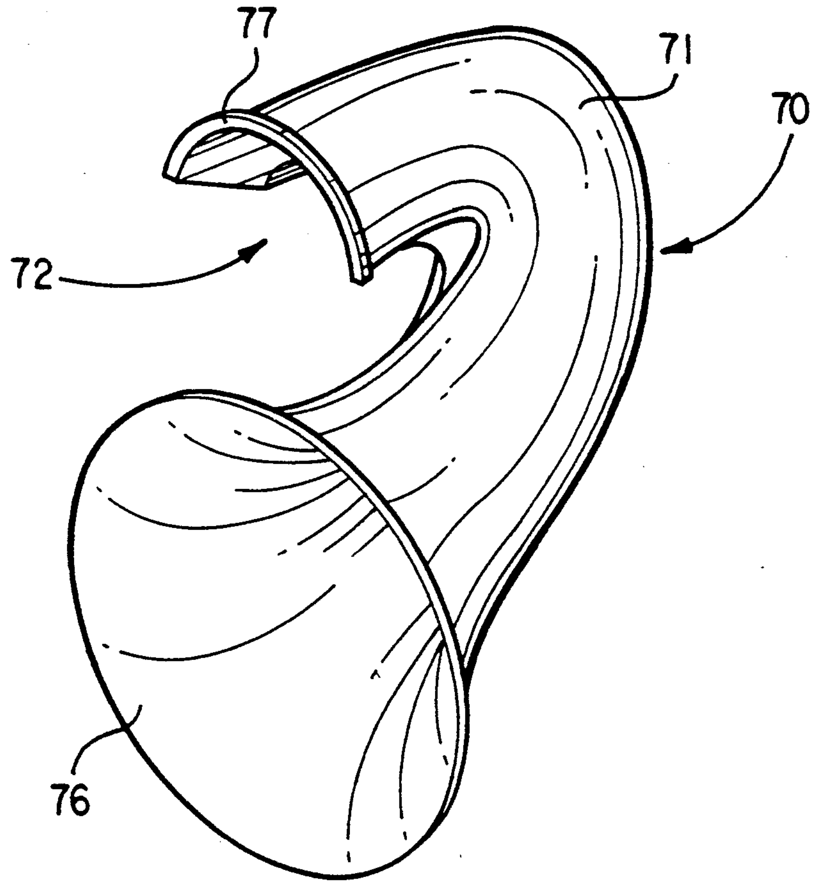
Figures 2, 10:
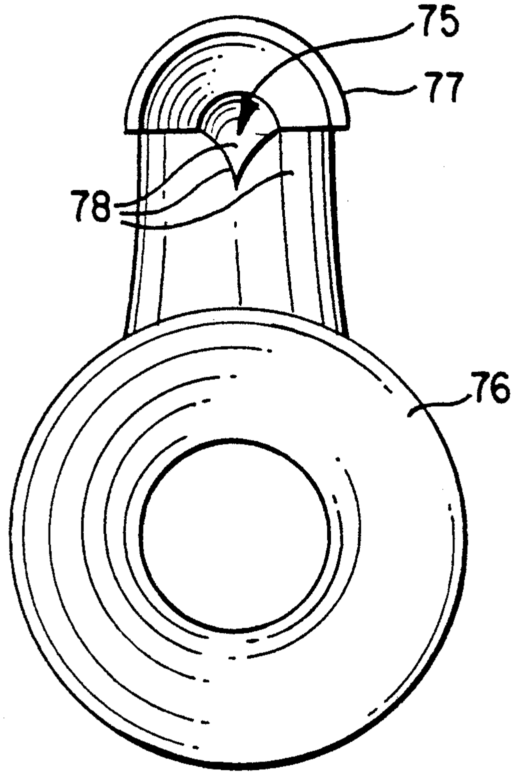
Figures 3, 10:
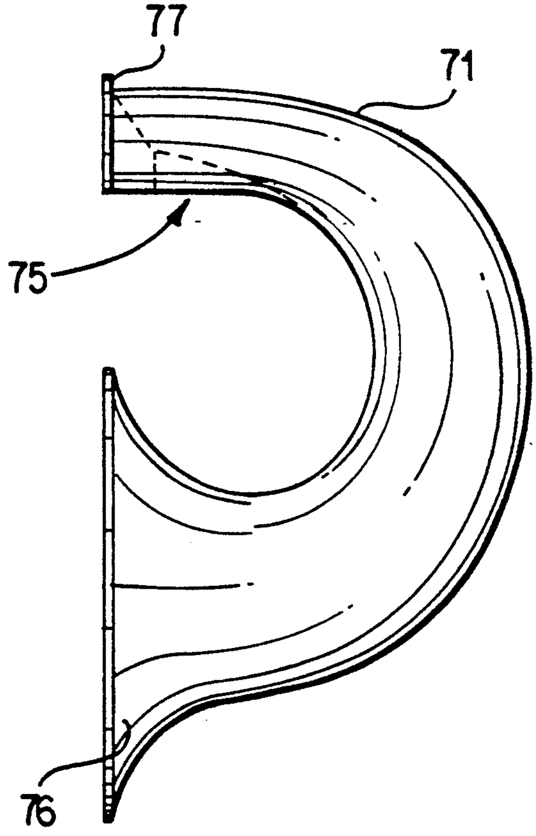
Figures 1, 11:
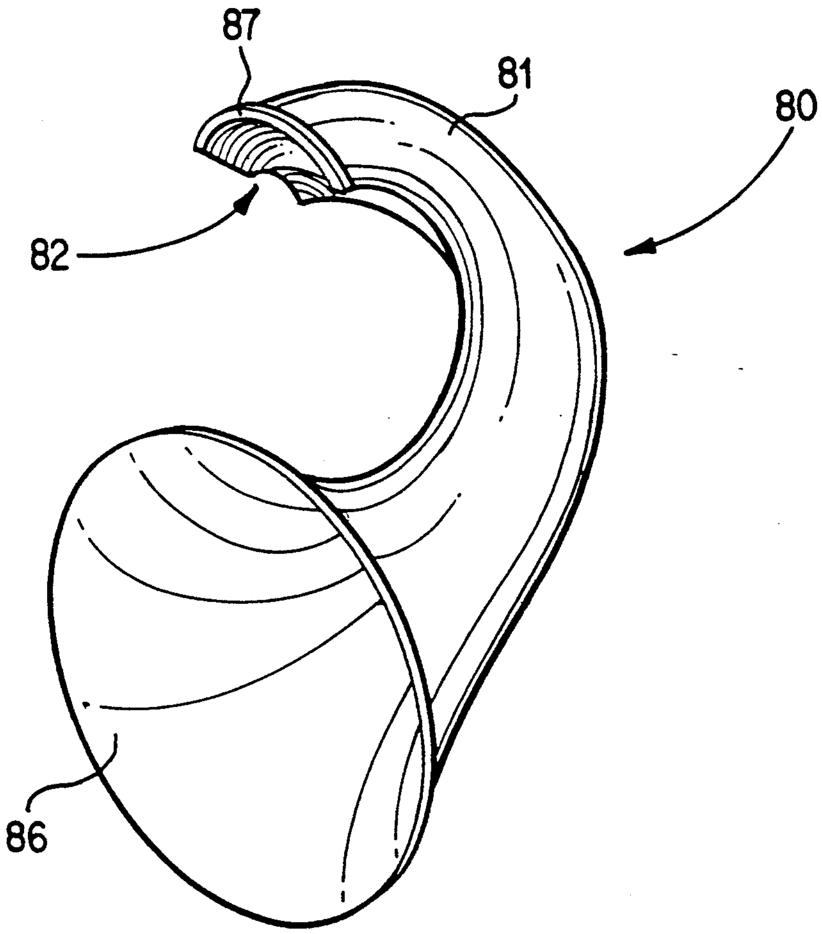
Figures 2, 11:
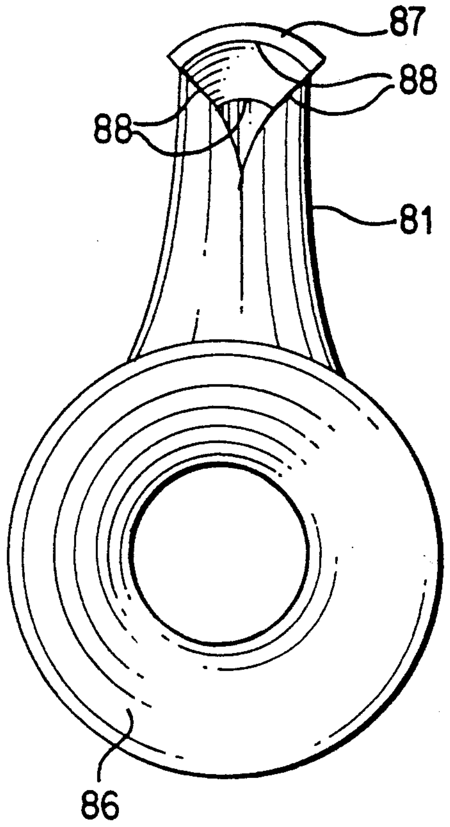
Figures 3, 11:
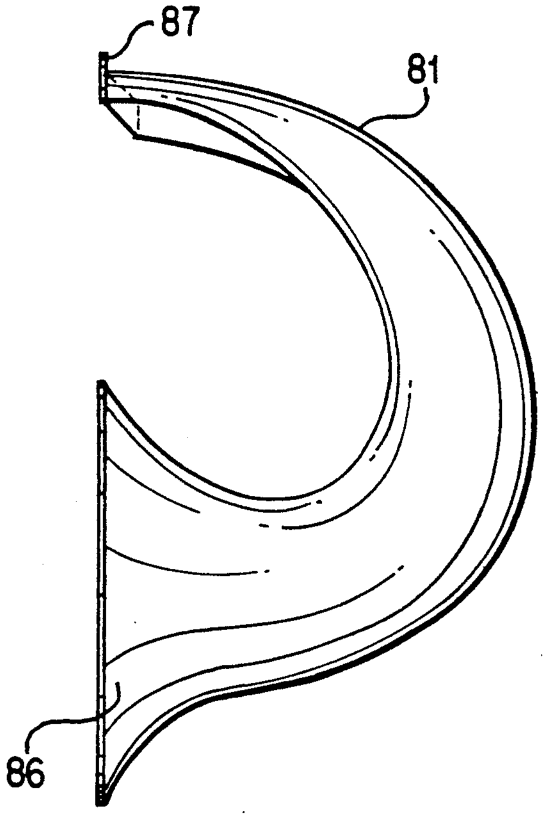

Alternatively, as illustrated in FIG. 9-1A, the fourth embodiment may fully cover the entire back area of the loudspeaker. That is, the present invention also contemplates a sound collecting and concentrating device (60*a*) in which the inlet end (62*a*) completely shrouds the back of the loudspeaker and not just three-fourth the area thereof. In this alternative embodiment, the inlet end substantially conforms to the circular back area of the speaker. Specifically, the inlet end will be circular when the speaker frame area is circular.

FIGS. 10-1, 10-2, and 10-3 illustrate the fifth embodiment which is very similar to the fourth embodiment, with the exception of encompassing only two quadrants or one-half of the back area of the loudspeaker. The sound collecting and concentrating device (70) comprises a sound collecting tube (71) with its inlet end (72) having a diameter that is substantially equal to that of a loudspeaker that is to be attached thereto. In the fifth embodiment, however, the inlet end (72) of the sound collecting tube is formed as a single unitary inlet which is designed to attach to two quadrants or one-half of the back of the loudspeaker frame using a rim or flange (77) formed at the inlet end. The flange is attached to a conventional flange formed in the conventional loudspeaker by said conventional means.

The inlet end in the fifth embodiment, in the similar manner as that of the fourth embodiment, is designed to shroud or cover two quadrants of the loudspeaker so that sound emitting or projecting from the back of the loudspeaker travels through the inlet end with a minimum sound interference and travels through and out the horn (76). Because the inlet end shrouds two quadrants of the back of the loudspeaker, the number of trapezoidal cutouts formed in the back of the loud speaker is not of concern, as long as the two quadrants fully cover the trapezoidal quadrants formed within the inlet end (72) and there is no undue interference from the frame reverberating sound passing therethrough. Moreover, a recessed cavity (75) that is formed by the walls (78) is provided to accommodate the protruding speaker driving means (3) of the loudspeaker. It is to be noted that, because only two quadrants of the loudspeaker are to be shrouded, the speaker driving means accommodating cavity (75) does not communicate with the collected sound traveling path, as can be clearly seen from FIGS. 10-2 and 10-3. In other words, walls (78) are formed to isolate the speaker driving means from the sound traveling path.

FIGS. 11-1, 11-2, and 11-3 illustrate the sixth embodiment which is also very similar to the fifth embodiment, with the exception of encompassing only one quadrant or one-quarter of the back outlet area of the loudspeaker. The sound collecting and concentrating device (80) comprises a sound collecting tube (81) with the inlet end (82) of the sound collecting tube being formed as a single unitary inlet which is designed to attach to a quadrant or one quarter of the back of the loudspeaker frame using a rim or flange (87) formed at the inlet end. The flange is attached to a conventional flange formed in the conventional loudspeaker by said conventional means.

The inlet end in the sixth embodiment, in the similar manner as that of the fourth embodiment, is designed to shroud or cover one quadrant of the loudspeaker so that sound emitting or projecting from the back of the loudspeaker travels through the inlet end with a minimum sound interference and travels through and out the horn (86).

The foregoing description is only illustrative of the principle of my invention. It is to be understood that the invention is not to be limited to the exact configuration and construction as illustrated and described herein. Accordingly, all expedient modifications may be made with the scope and spirit of my invention. For example, the sound collecting tube need not be limited to five tubes. The number of tubes can depend on the diameter of the loudspeaker or as matter of listeners preference.

I claim:

1. A sound collecting and directing device for use with a loudspeaker having a diaphragm with a frontal side which generally faces an ambient surrounding and a back side which faces opposite the frontal side; a frame means which operatively supports the diaphragm and a speaker driving means, the frame means having a flange at its outermost peripheral edge; and a plurality of sound venting cut-outs in the frame means to permit sound waves to substantially freely pass therethrough, said device comprising:

- a sound collecting tube having an inlet tube and an outlet end, said inlet end having a flange means for attaching to the flange of the frame means to attach said inlet end to the frame means to shroud said inlet end over at least one of the cutouts in the frame means and means for isolating the speaker driving means from the sound traveling path in said sound collecting tube; and
- a sound concentrating and directing horn means formed at said outlet end of said sound collecting tube, wherein said sound collecting tube is for collecting sound emitting from the back side of the diaphragm and directing into said horn means.

2. A sound collecting and directing device according to claim 1, wherein said inlet end has four inlet end segments for attaching to the frame means which has at least four sound venting cut-outs, each end segment for shrouding over at least one sound venting cutout.

3. A sound collecting and directing device according to claim 2, wherein said four end segments are substantially identical in shape, each end segment for shrouding over one of the sound venting cut-outs.

4. A sound collecting and directing device according to claim 2, wherein each end segment has a curved trapezoidal cross-section that conforms to the shape of the frame means of the loudspeaker.

5. A sound collecting and directing device according to claim 3, wherein each end segment has a curved trapezoidal cross-section that conforms to the shape of the frame means of the loudspeaker.

6. A sound collecting and directing device according to claim 1, wherein said inlet end comprises a tube having three quadrants or three-fourth of the the area of the frame means to shroud over three quadrants or three-fourth the area of the frame means, said inlet end tube being smoothly formed into a substantially circular tube toward said outlet end.

7. A sound collecting and directing device according to claim 1, wherein said inlet end comprises a semicircular tube for shrouding over one-half the area of the frame means, said semi-circular tube being smoothly formed into a substantially circular tube toward said outlet end.

8. A sound collecting and directing device according to claim 1, wherein said inlet end comprises a trapezoidal shaped cross-sectional tube for shrouding over one quadrant or one-fourth the area of the frame means, said trapezoidal shaped cross-sectional tube smoothly forms to a substantially circular cross-section tube toward said outlet end.

9. A sound collecting and directing device according to claim 8, wherein said inlet end is for shrouding over only one trapezoidal cut-out in the frame means.

10. A sound collecting and directing device according to claim 1, wherein said isolating means is a recessed cavity formed by the wall forming said inlet end of said sound collecting tube.

11. A sound collecting and directing device for use with a loudspeaker having a diaphragm with a frontal side which generally faces an ambient surrounding and a back side which faces opposite the frontal side; a frame means for operatively supporting the diaphragm and a speaker driving means, the frame means having a flange at its outermost peripheral edge; and at least two sound venting cut-outs in the frame means, which permit sound waves to substantially freely pass therethrough, said device comprising:

- a sound collecting tube having an inlet end and an outlet end, said inlet end having a flange means for attaching to the flange of the frame means to attach said inlet end to the frame means to shroud said inlet end over at least one of the cut-outs in the frame means and means for isolating the speaker driving means from the sound traveling path in said sound collecting tube; and
- a sound concentrating and directing horn means formed at said outlet end of said sound collecting tube, wherein said sound collecting tube is for collecting sound emitting from the back side of the diaphragm and directing into said horn means.

12. A sound collecting and directing device according to claim 11, wherein said isolating means is a recessed cavity formed by the wall forming said inlet end of said sound collecting tube.

13. A sound collecting and directing device according to claim 11, wherein said inlet end has four inlet end segments for attaching to the frame means which has at least four sound venting cut-outs in the frame means, each end segment for shrouding over at least one sound venting cut-out.

14. A sound collecting and directing device according to claim 11, wherein said inlet end comprises a tube having three quadrants or three-fourth of the area of the frame means to shroud over three quadrants or three-fourth the area of the frame means, said inlet end tube smoothly forming into a substantially circular tube toward said outlet end.

15. A sound collecting and directing device according to claim 11, wherein said inlet end comprises a semicircular tube for shrouding over one-half the area of the frame means, said semi-circular tube being smoothly formed into a substantially circular tube toward said outlet end.

16. A sound collecting and directing device according to claim 11, wherein said inlet end comprises a trapezoidal shaped cross-sectional tube for shrouding over one quadrant or one-fourth the area of the frame means, the cross section of the sound concentrating tube changing from the trapezoidal-shape to a substantially circular shape toward the outlet end, wherein said inlet end is for shrouding over one cutout in the frame means.

17. A loudspeaker system comprising:

a) a loudspeaker comprising:
   - a diaphragm with a frontal side which generally faces an ambient surrounding and a back side which faces opposite said frontal side;
   - a speaker driving means operatively connected to said diaphragm to cause said diaphragm to vibrate;
   - a frame means for operatively supporting said diaphragm and said speaker driving means, said frame means having a flange at its outermost peripheral edge; and
   - at least two sound venting cut-outs in said frame means to permit sound waves to substantially freely pass therethrough, and b) a sound collecting and directing device formed on said frame means, said device comprising:
   - a sound collecting tube having an inlet end and an outlet end, said inlet end having a flange means for attaching to said flange of said frame means to attach said inlet end to said frame means to shroud said inlet end over at least one of said cut-outs in said frame means and means for isolating the speaker driving means from the sound traveling path in said sound collecting tube; and
   - a sound concentrating and directing horn means formed at said outlet end of said sound collecting tube, wherein said sound collecting tube collects sound emitted from the back side of said diaphragm and directs into said horn means.

18. A sound collecting and directing device according to claim 17, wherein said isolating means is a recessed cavity formed by the wall forming said inlet end of said sound collecting tube.

19. A sound collecting and directing device according to claim 17, wherein said frame has at least four sound venting cut-outs and said inlet end has four inlet end segments for shrouding over said sound venting cut-outs, each end segment for shrouding over at least one sound venting cut-out.

20. A sound collecting and directing device according to claim 17, wherein said inlet end comprises a tube having three quadrants or three-fourth of the area of said frame means to shroud over three quadrants or three-fourth the area of said frame means, said inlet end tube smoothly forming into a substantially circular tube toward said outlet end.

21. A sound collecting and directing device according to claim 17, wherein said inlet end comprises a semicircular tube for shrouding over one-half the area of said frame means, said semi-circular tube being smoothly formed into a substantially circular tube toward said outlet end.

22. A sound collecting and directing device according to claim 17, wherein said inlet end comprises a trapezoidal shaped cross-sectional tube for shrouding over one quadrant or one-fourth the area of said frame means, the cross section of said sound collecting tube changing from the trapezoidal-shape to a substantially circular-shape toward said outlet end, wherein said inlet end is for shrouding over one cutout in said frame means.

* * * * *